US009318680B2

(12) United States Patent
Tosi et al.

(10) Patent No.: US 9,318,680 B2
(45) Date of Patent: Apr. 19, 2016

(54) APPARATUS, SYSTEM AND METHOD FOR GENERATING POWER IN A WELLBORE

(75) Inventors: Luis Phillipe Tosi, Houston, TX (US); Krystian K. Maskos, Houston, TX (US); Scott Wagstaff, Spring, TX (US)

(73) Assignee: CHEVRON U.S.A. INC., San Ramon, CA (US)

( * ) Notice: Subject to any disclaimer, the term of this patent is extended or adjusted under 35 U.S.C. 154(b) by 719 days.

(21) Appl. No.: 13/231,652

(22) Filed: Sep. 13, 2011

(65) Prior Publication Data

US 2013/0061899 A1  Mar. 14, 2013

(51) Int. Cl.
| | |
|---|---|
| *H01L 37/00* | (2006.01) |
| *E21B 43/01* | (2006.01) |
| *E21B 47/00* | (2012.01) |
| *H01L 35/28* | (2006.01) |
| *H01L 35/00* | (2006.01) |
| *G21H 1/10* | (2006.01) |
| *E21B 41/00* | (2006.01) |

(52) U.S. Cl.
CPC ............ *H01L 35/28* (2013.01); *E21B 41/0085* (2013.01); *G21H 1/103* (2013.01); *H01L 35/00* (2013.01)

(58) Field of Classification Search
CPC ...... E21B 41/0085; H01L 35/00; H01L 31/28
USPC ................................................. 136/200–242
See application file for complete search history.

(56) References Cited

U.S. PATENT DOCUMENTS

| | | | |
|---|---|---|---|
| 3,564,302 A * | 2/1971 | Levedahl et al. ............. 376/321 |
| 4,204,882 A | 5/1980 | Howell | |
| 4,211,279 A * | 7/1980 | Isaacks ................. E21B 43/122 |
| | | | 166/106 |
| 4,805,407 A | 2/1989 | Buchanan | |
| 6,150,601 A | 11/2000 | Schnatzmeyer et al. | |
| 6,380,476 B1 | 4/2002 | Heijnen et al. | |
| 6,433,991 B1 * | 8/2002 | Deaton ................... E21B 23/00 |
| | | | 166/65.1 |
| 6,766,141 B1 | 7/2004 | Briles et al. | |
| 7,647,979 B2 | 1/2010 | Shipley et al. | |

(Continued)

FOREIGN PATENT DOCUMENTS

WO          03067029          8/2003

OTHER PUBLICATIONS

Øyri, WIPO publication No. WO 03/067029 A1, Aug. 14, 2003.*
O'Brien et al., "Safe radioisotope thermoelectric generators and heat sources for space applications", Journal of Nuclear Materials, 2008.*
International Search Report for International Application No. PCT/US2012/049270 dated Jan. 31, 2013, 3 pages.

Primary Examiner — Allison Bourke
Assistant Examiner — Niki Bakhtiari
(74) Attorney, Agent, or Firm — King & Spalding LLP

(57) ABSTRACT

An apparatus, system and method provides electrical power in a subterranean well. A radioisotope thermoelectric generator may be positioned and installed in a downhole location in a wellbore. The location of the radioisotope thermoelectric generator may be within a completion string. A radioisotope thermoelectric generator comprises a core having a radioisotope for producing heat, and a thermocouple. The thermocouple comprises at least two different metals, and is positioned adjacent to the core. The radioisotope thermoelectric generator flows heat from the core to the thermocouple to produce electricity that may be stored in an energy storage device, or used to power a component. The produced electrical power may be employed to activate downhole sensors, valves, or wireless transmitters associated with the operation and production of an oil or gas well.

12 Claims, 3 Drawing Sheets

(56) References Cited

U.S. PATENT DOCUMENTS 7,770,645 B2    8/2010    Jeffryes
2005/0024231 A1    2/2005    Fincher et al.
2007/0101740 A1*    5/2007    Akei et al. .................. 62/238.7

* cited by examiner

APPARATUS, SYSTEM AND METHOD FOR GENERATING POWER IN A WELLBORE

FIELD OF THE INVENTION

The invention is directed to a system, apparatus and method for generating power in a well bore.

BACKGROUND OF THE INVENTION

In modern oil and gas production it is desirable to position in a well devices that require a source of electrical power. Energy consuming devices may be employed downhole to perform a variety of tasks. For example, sensors may be positioned within a casing for monitoring fluid flow pressure, temperature, flow rates, and to characterize the fluid content of the flow. Other sensing devices can be useful to measure fluid viscosity and density.

With the advent of reservoir management techniques, sophisticated monitoring and valve systems have been integrated into wellbore tubing. This allows portions of a subterranean formation to be open to producing oil/gas up the wellbore, while at the same time other portions of the formation are sealed to avoid production into the wellbore. This may be accomplished by controlling downhole valves. To achieve maximum reservoir performance, it may be necessary to flow from only selected portions of the reservoir at a given time. Subterranean flow monitors and flow control systems may require an external power source to activate such valves during the life of a wellbore.

Modern subsea wells may be drilled to depths of as much as 20,000 feet or more, extending from the mud line on the ocean floor downward to the hydrocarbon producing formation. Such wells may utilize downhole valves that must be activated to open or close various portions of the reservoir to production. The determination of when valves should be open or closed may depend upon the character of the fluid being produced by the formation over the life of the well. Such wells may have a life of 20-25 years or more. Downhole sensors may be employed to determine when the wellbore conditions require the opening or closing of such valves, based in part on temperature, pressure, or content of the fluids produced at a given time during the productive life of a well.

In the past, it has been common to deploy electrical conductive cables for miles into a reservoir down to a completion string near the bottom of the well. Such electrical conductive cables fail for a variety of reasons, which may require expensive and time consuming workover operations to repair the cables. Such cables are very expensive and heavy, and require substantial expertise and care to deploy downhole. Workover operations to repair damaged cables may require several weeks of effort, and may cost as much as 22 million dollars.

There is a need in the industry for an apparatus and system for producing downhole power that can be installed for long term use in a well. The apparatus and system needs to be capable of supplying downhole power in the relatively harsh wellbore environment without the need to run electrical conductive cables the entire length of the well. A device that can generate or supply a steady source of power deep within a reservoir for long periods of time without removal from a well and without requiring electrical conductive cable connections from the power source to the surface would be highly desirable. A downhole power source that can supply a steady and long term source of power to sensors, valves or other wellbore devices is needed.

SUMMARY OF THE INVENTION

A system for providing electrical power in a subterranean well is disclosed. The system comprises a radioisotope thermoelectric generator positioned and installed in a downhole location. The radioisotope thermoelectric generator comprises a core having a radioisotope for producing heat and a thermocouple positioned adjacent to the core. The radioisotope thermoelectric generator flows heat from the core to the thermocouple to produce electricity. The thermocouple is connected to a conductive cable for transmitting electricity along the conductive cable to an energy storage device or to a component in the well. The radioisotope employed may be selected from one or more of the following radioisotopes: plutonium, uranium, curium, strontium, polonium, promethium, caesium, cerium, ruthenium, cobalt, thulium, and americium.

The component may be a valve, sensor, or wireless transmitter, in various embodiments of the invention. If a wireless transmitter is employed, it may be configured for producing acoustic signals or configured for producing electromagnetic signals for propagation upwards within the well.

Such a system may provide electrical power in a wellbore, the wellbore having installed therein a completion string. Production tubing within the completion string may be configured for transportation of hydrocarbons from a subterranean formation upwards through a completion string to the surface.

The system further may comprise in another embodiment a first downhole receiver for receiving data signals from a wireless transmitter. The first downhole receiver may comprise a processing and transmission system, the processing and transmission system being adapted for processing data signals from the wireless transmitter and further processing and propagating the signals upwards to a second receiver. Signals received by the second receiver may be processed and sent upwards to the ground surface by telemetry communication, in one embodiment of the invention.

Telemetry communication may be employed in the practice of the invention. Such telemetry communication may be characterized by generating an electromagnetic signal having a chosen frequency at the proximal end of the electrically conducting pipe such that the electrically conducting pipe radiates the signal at least in the vicinity of the distal end thereof. The frequency may be chosen for the particular application. In some instances, radio frequency is suitable, but in other cases, a frequency band of shorter or longer wavelength may be employed.

Then, the radiated signal may be reflected in the vicinity of the distal end of the electrically conducting pipe such that the reflected signal is received by the conducting pipe and transmitted to the proximal end thereof. Then, it is possible to modulate the reflected signal in response to data received from the vicinity of the distal end of the electrically conducting pipe. At that point, it is possible to detect the modulated, reflected signal at the proximal end of the electrically conducting pipe.

The invention also may comprise a method for generating power in a completion string of a wellbore by providing a radioisotope thermoelectric generator positioned and installed within a completion string. The radioisotope thermoelectric generator includes a core having a radioisotope for producing heat and a thermocouple positioned adjacent to the core. Heat is generated in the core by radioactive decay of the radioisotope. Then, heat is flowed from the core to the thermocouple to produce electricity.

The method may comprise the additional step of employing the produced electricity to activate a valve, a sensor, or a wireless transmitter. Such a wireless transmitter may produce acoustic signals or electromagnetic signals, as non-limiting examples.

In one embodiment, it is possible to employ electricity to activate a sensor and then determine the characteristics of fluid production into a well. The electricity may be employed to activate a valve to regulate fluid production into the well. Such a sensor may measure and report temperature and/or pressure characteristics. In yet another embodiment of the invention, the sensor may measure and report water content of production fluids. Such a sensor may be employed to measure and report oil content or gas content of production fluids. In other embodiments of the invention, the sensor may be employed to measure and report the ratio of water produced to the total volume of liquids produced (i.e. the "water cut") in a subterranean zone within the well. Further, energy storage devices, such as capacitors or batteries could be connected to the power source for receipt and storage of power.

BRIEF DESCRIPTION OF THE FIGURES

The invention is illustrated in several embodiments, as set forth in the Figures.

DETAILED DESCRIPTION OF THE INVENTION

Downhole thermoelectric generators as employed in the practice of the invention employ thermoelectric materials to convert a subsurface heat differential into electrical power. Thermoelectric materials generate a voltage in response to an applied temperature differential. When used in series with an electrical load, current and power are generated. When no current is drawn, thermoelectric materials normally create a voltage correlated to the temperature differential, the coefficient of proportionality being known as the Seebeck coefficient.

In application of the invention, it may be possible to avoid the penetration of conductive cable through production packers and/or hanger assemblies, which is a significant advantage in the industry. Such generators may provide a long term and reliable source of power in a downhole environment. Further, the heat may be produced at a predictable and steadily decreasing rate that depends upon the amount of fuel isotope employed, and its half-life. Adequate cooling is provided as well. The generator of the system may be employed in conjunction with sensors, gauges, interval control valves, energy storage systems such as capacitors or batteries, and wireless telemetry systems (acoustic or electromagnetic).

Figure 1:
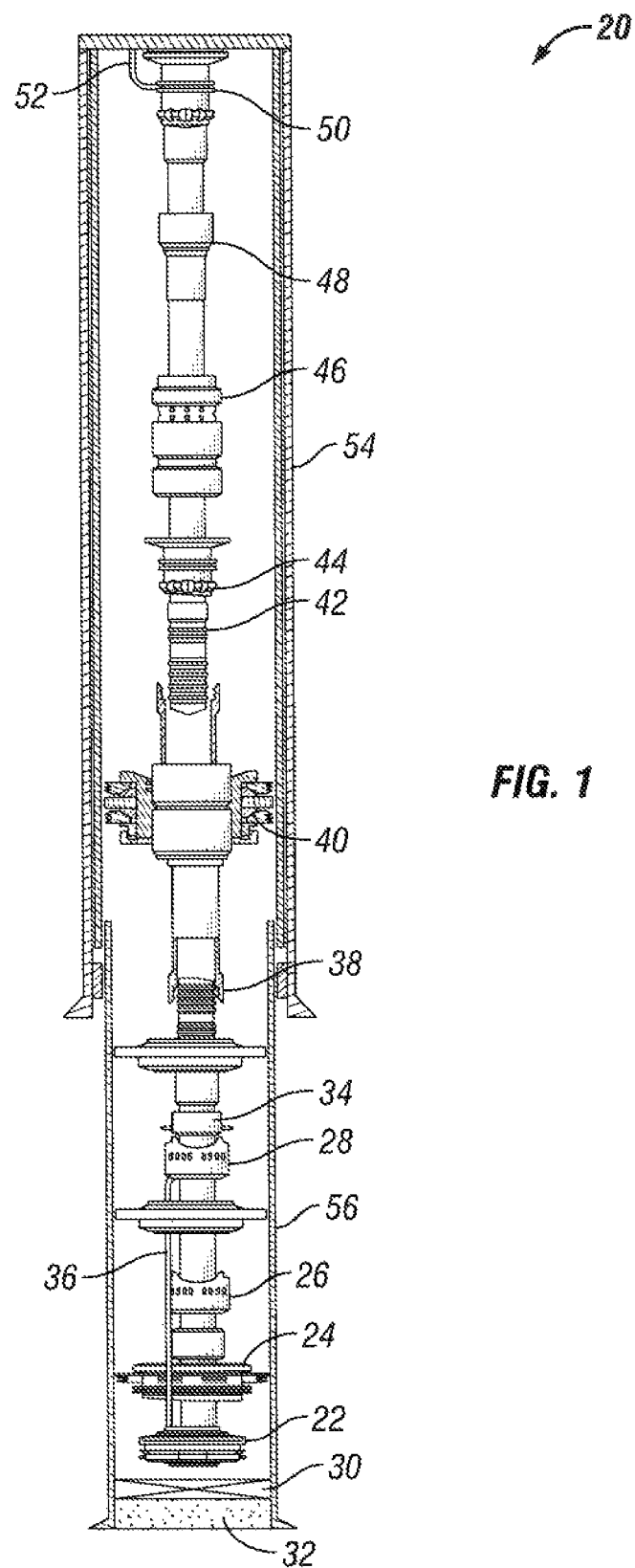
FIG. 1 shows a wellbore having suspended therein a production tubing string with a radioisotope thermoelectric generator positioned in the lower portion of the tubing string.

In FIG. 1, a first embodiment of the invention is illustrated. Wellbore 20 comprises a system for power generation positioned within a subterranean formation. The casing 54 of a well suspends a production tubing 56 that extends to the bottom of the well. Cement 32 seals the bottom of the production tubing 56, while a float collar 30 is positioned above the cement 32. A radioisotope thermoelectric generator 22 is positioned in the bottom of the well, and is capable of generating electrical current for long periods of time without intervention or recharge. Power generated by the radioisotope thermoelectric generator 22 may be provided along conductive cable 36 to a number of different devices, including for example valves, sensors (not shown), or other downhole devices that use power. In the case of the embodiment of FIG. 1, power is provided to electric interval control valves 26, 28 and wireless transmitter 34. Power from conductive cable 36 may be employed to activate the control valves 26, 28 or may be employed to activate the wireless transmitter 34.

An inverted polished bore receptable ("PBR") 38 is shown below the production packer 40. The PBR 38 is a seal assembly designed for specific application as an expansion joint, providing stroke length for extreme production tubing 56 movement during well treatment and production. As a separation tool, the PBR 38 facilitates the removal of the production tubing 56 string, while leaving a polished bore and anchor seal assembly set in a packer.

The production packer 40 is a component of the completion hardware used to provide a seal between the outside of the production tubing and the inside of the casing, liner, or wellbore wall. Production packers remain in the well during well production. In FIG. 1, the production packer 40 is positioned below the second polished bore receptacle 42, and has been run in close to the bottom end of the production tubing 56. The production packer 40 is set at a point above the top perforations or sand screens (not shown in FIG. 1).

A wireless downhole transmitter/receiver 44 may employ microprocessor controlled frequency synthesis. It may receive signals transmitted from below, and is adapted for two-way communication to the surface (or to another communication device) in an appropriate frequency range, which may be in the range of from about 1 Hz to about 300 GHz. In some other applications, the frequency range that may be employed is from about 1 Hz to about 50 MHz. Data gathered by the downhole transmitter/receiver 44 may be encoded in digital format and transmitted electromagnetically and wirelessly to the surface or to relay station/transmitter 50 by a signal processor unit (not shown), or alternately may be encoded for acoustic transmission to relay station/transmitter 50. Relay station/transmitter 50 receives power from conductive cable 52 run from the top of the wellbore 20.

Electrical submersible pump 46 also may reside within the production string, and is positioned between the downhole transmitter/receiver 44 and the surface controlled subsurface safety valve 48.

Figure 2:
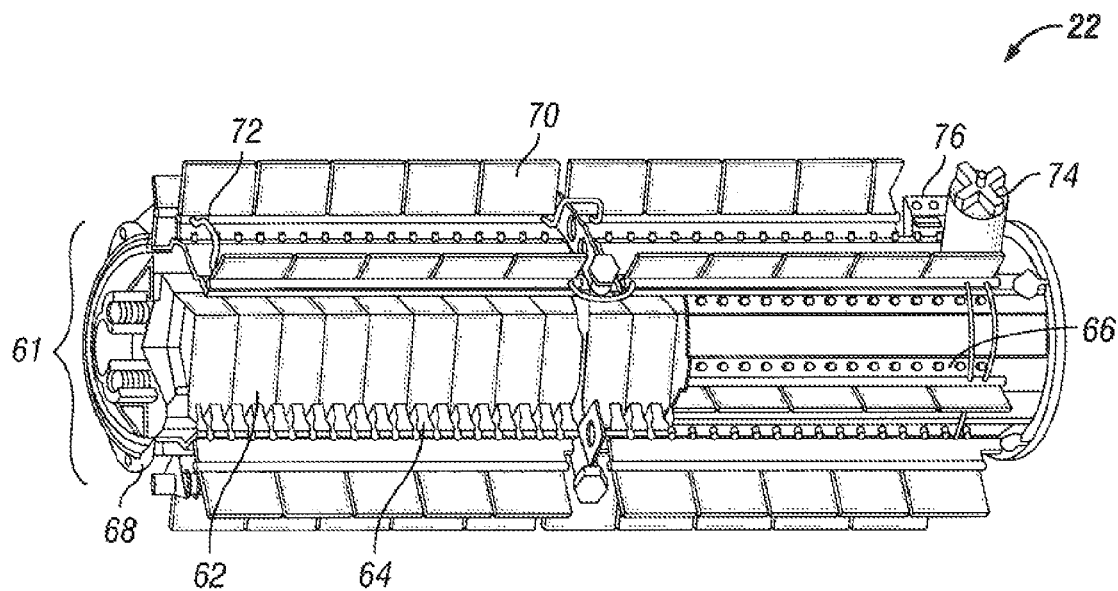
FIG. 2 illustrates the internal component parts of a radioisotope thermoelectric generator.

The radioisotope thermoelectric generator 22 of the invention is shown in FIG. 2, which shows a partial cut-away view of the device. A radioisotope 62 is held within the core 61. The radioisotope employed may be selected from one or more of plutonium, uranium, curium, strontium, polonium, promethium, caesium, cerium, ruthenium, cobalt, thulium, and americium. In some applications, plutonium may be employed, but for other applications, americium may be beneficial. The identity of the isotope employed may depend upon radioisotope total cost, half-life, environmental concerns, and other considerations.

One structure of a radioisotope generator 22 is shown, although it is recognized that other specific structures could be employed. Core 61, containing the radioisotope, is held upon support frame 66. A thermocouple 64 of two different metals is provided in close proximity to the core 62, and may be wound upon the core 62. Heat moves from the radioisotope 62 to the thermocouple 64 as a consequence of radioactive decay of the radioisotope 62.

One type of thermocouple 64 that may be employed is a silicon-germanium thermocouple, but other metals may be employed depending upon the configuration and process specifications of the radioisotope generator 22. In general, a thermocouple is a device consisting of two different conductors (usually metal alloys or semiconductors) that produce a voltage proportional to a temperature difference between either end of the pair of conductors. In this application, thermocouple 64 is used to convert a heat gradient into electricity. In contrast to most other methods of temperature measurement, thermocouples are self-powered and require no external form of excitation. The two metals may be connected to each other in a closed electrical loop. A junction of dissimilar metals is capable of producing an electric potential related to temperature. Thermocouples for practical measurement of temperature are junctions of specific alloys which have a predictable and repeatable relationship between temperature and voltage. Different alloys may be used for different temperature ranges. Properties such as resistance to corrosion may also be important when choosing the type of thermocouple to be employed. Electronic instruments may be employed to compensate for the varying characteristics of the thermocouple, and so improve the precision and accuracy of measurements.

The radioisotope generator 22 is provided with a mounting flange 68, and an outer shell assembly 70, which may be construed of a metal such as aluminum. Cooling tubes 72 act in concert with an active cooling system manifold 76 to maintain temperature control. A pressure relief valve 74 is provided for relief of pressure, and will be set to open when needed to relieve pressure.

Figure 3:
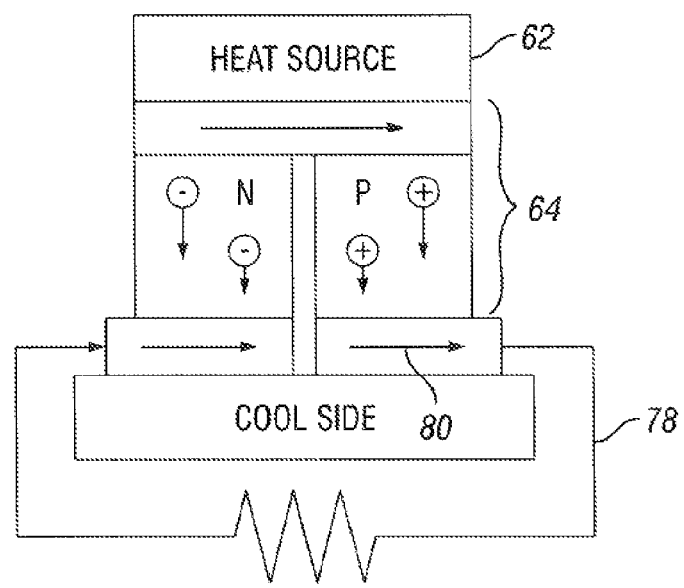
FIG. 3 illustrates schematically the manner of electricity generation in a radioisotope thermoelectric generator.

A schematic showing the mechanism of operation of the radioisotope generator 22 is shown in FIG. 3. A heat source, in this case a radioisotope 62, is applied to dissimilar metals in thermocouple 64 to produce a voltage proportional to a temperature difference between either end of the pair of conductors. This voltage provides electrical current 80 in circuit 78. This electrical current 80 may be applied to charge an energy storage device, or may be used immediately, depending upon the application. A processor (not shown) may be provided to regulate the flow of energy in the system, which may in some instances include transfer to an energy storage device (not shown).

Figure 4:
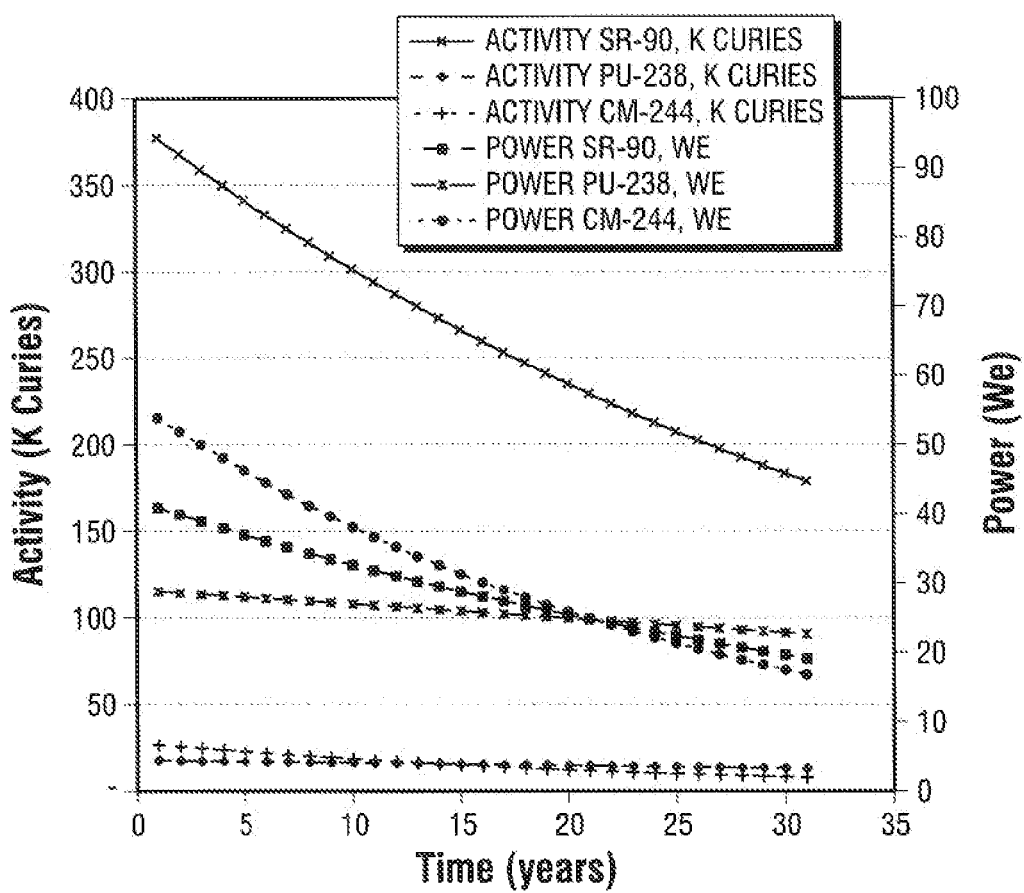
FIG. 4 depicts graphically the electrical power that may be provided by use of such generators as the radioactive component decays over time.

FIG. 4 provides an illustration of the long term power generation characteristics of the radioisotope thermoelectric generator 22. Power reduction is experienced over time due to radioactive decay. Thermocouples are generally reliable and long-lasting, but are relatively inefficient in converting the heat to power (about 3-7% efficiency on average). The power and activity of various radioisotopes may be seen in FIG. 4. Cost, power production, and environmental issues may determine the most appropriate radioisotope to be employed for a given downhole power application.

It is recognized that multiple radioisotope generators 22 could be deployed and installed adjacent to a component to which the respective generator(s) 22 provide power. This may be particularly useful for instances in which there are long distances between components that are to receive downhole power. In such applications, generators 22 could be positioned adjacent to their respective components.

Persons of skill in the art may recognize that U.S. Pat. No. 6,766,141 describes a telemetry-based method of communication in the wellbore. Such a system may be employed in the practice of this invention. The method includes an apparatus and method for telemetry communication with oil-well monitoring and recording instruments located in the vicinity of the bottom of gas or oil recovery pipes. Modulated reflectance, provides a wireless communication method that does not require signal transmission power from the telemetry package, and will provide a long-lived and reliable way to monitor down-hole conditions. Such a system may be employed in the practice of the present invention, as further described herein. Although modulated reflectance reduces or eliminates the loss of energy at the sensor package because energy is not consumed during the transmission process, additional stored extra energy downhole may be applied. The electrical energy generated downhole by the radioisotope thermoelectric generator of the invention may be employed to power various devices, including for example a well communications system. Telemetry communication may be employed in the practice of the invention. Such telemetry communication may be characterized by generating a radio frequency signal having a chosen frequency at the proximal end of the electrically conducting pipe such that the electrically conducting pipe radiates the signal at least in the vicinity of the distal end thereof. Then, it is possible to modulate the reflected radio frequency signal in response to data received from the vicinity of the distal end of the electrically conducting pipe. This facilitates detection of the modulated, reflected signal at the proximal end of an electrically conducting pipe.

The invention is shown by example in the illustrated embodiments. However, it is recognized that other embodiments of the invention having a different configuration but achieving the same or similar result are within the scope and spirit of the claimed invention.

What is claimed is:

1. A system for providing electrical power in a subterranean well, the system comprising:
   (a) a radioisotope thermoelectric generator positioned and installed in a downhole location;
   (b) the radioisotope thermoelectric generator comprising:
      (i) a core having a radioisotope for producing heat, and
      (ii) a thermocouple positioned adjacent to the core,
   (c) the radioisotope thermoelectric generator being configured for flowing heat from the core to the thermocouple to produce electricity;
   (d) providing a production packer in the subterranean well, the radioisotope thermoelectric generator being positioned below the production packer;
   (e) providing a production tubing extending below the production packer in the subterranean well;
   (f) providing at least one electric interval control valve in the subterranean well, the electric interval control valve being positioned below the production packer, the electric interval control valve being adapted for regulating reservoir flow to the production tubing of the subterranean well;
   (g) transmitting the electricity along a conductive cable to the electric interval control valve in the subterranean well to regulate the electric interval control valve, thereby regulating flow from the subterranean formation to the production tubing wherein the conductive cable is located in the annulus between a production string and the production tubing thereby connecting the electric interval control valve with the radioisotope thermoelectric generator;
   (h) wherein flow into the subterranean well may be regulated using electrical power wherein such electrical power is generated at a position below the production packer; and
   (i) wherein cabled transmission of electrical power across a packer is not required in the system.

2. The system of claim 1 wherein the radioisotope is selected from one or more of the following radioisotopes: uranium, curium, strontium, polonium, promethium, caesium, cerium, ruthenium, cobalt, and thulium.

3. The system of claim 1 further wherein electrical power is supplied to a sensor positioned downhole below a production packer.

4. The system of claim 1 further wherein electrical power is supplied to a wireless transmitter.

5. The system of claim 4 wherein the wireless transmitter is configured for producing acoustic signals.

6. The system of claim 4 wherein the wireless transmitter is configured for producing electromagnetic signals for propagation upwards within the well.

7. The system of claim 1 further wherein electrical power is supplied to an energy storage device.

8. A method of generating power and controlling flow in a subterranean formation in a well below a production packer, the method comprising:
   (a) providing a radioisotope thermoelectric generator positioned and installed within a completion string and below a production packer in a subterranean well, the radioisotope thermoelectric generator comprising a core having a radioisotope for producing heat and a thermocouple positioned adjacent to the core;
   (b) generating heat in the core by radioactive decay of the radioisotope;
   (c) flowing heat from the core to the thermocouple;
   (d) producing electricity;
   (e) providing a production packer in the subterranean well, the radioisotope thermoelectric generator being positioned below the production packer;
   (f) providing a production tubing below the production packer in the subterranean well;
   (g) providing at least one electric interval control valve in the subterranean well, the electric interval control valve being positioned below the production packer, the electric interval control valve being adapted for regulating reservoir flow to the production tubing of the subterranean well;
   (h) transmitting the electricity along a conductive cable, which is located between the production tubing and a production string, to the electric interval control valve in the subterranean well to regulate the electric interval control valve, thereby regulating flow from the subterranean formation to the production tubing of the subterranean well; and
   (i) wherein flow into the subterranean well may be regulated using electrical power wherein such electrical power is generated at a position below the production packer wherein cabled transmission of electrical power across a packer is not required in the system.

9. The method of claim 8 comprising the additional step of: employing the electricity to activate a sensor.

10. The method of claim 8 comprising the additional step of:
   employing the electricity to activate a wireless transmitter.

11. The method of claim 10 wherein the wireless transmitter produces acoustic signals.

12. The method of claim 10 wherein the wireless transmitter produces electromagnetic signals.

* * * * *